(12) United States Patent
Toth (10) Patent No.: US 6,205,106 B1
(45) Date of Patent: Mar. 20, 2001

(54) MEMORY CARD RECORDING/ REPRODUCING WITH TWO LIGHT SOURCES AND A LIGHT VALUE MATRIX

(76) Inventor: Peter Toth, Televägen 6, S-374 52 Asarum (SE)

( * ) Notice: Subject to any disclaimer, the term of this patent is extended or adjusted under 35 U.S.C. 154(b) by 0 days.

(21) Appl. No.: 09/029,871

(22) PCT Filed: Sep. 6, 1996

(86) PCT No.: PCT/SE96/01105

§ 371 Date: Mar. 2, 1998

§ 102(e) Date: Mar. 2, 1998

(87) PCT Pub. No.: WO97/09720

PCT Pub. Date: Mar. 13, 1997

(30) Foreign Application Priority Data

Sep. 5, 1995 (SE) .................................................... 9503062

(51) Int. Cl.$^7$ ...................................................... G11B 7/00
(52) U.S. Cl. .................. 369/102; 369/112; 369/44.37; 369/94; 369/124.12; 365/108; 365/235
(58) Field of Search .................................. 369/102, 112, 369/116, 103, 288, 275.2, 44.41, 44.37, 44.23, 94, 124.12; 365/234, 216, 235, 215, 64, 108; 348/49; 235/487, 457

(56) References Cited

U.S. PATENT DOCUMENTS

| | | | |
|---|---|---|---|
| 4,005,394 | * 1/1977 | Kiemle | 359/25 |
| 4,400,616 | * 8/1983 | Chevillat et al. | 235/487 |
| 4,633,445 | 12/1986 | Sprague . | |
| 4,837,745 | * 6/1989 | Eich et al. | 365/108 |
| 5,311,474 | 5/1994 | Urban . | |
| 5,379,266 | 1/1995 | Russell . | |
| 5,479,384 | * 12/1995 | Toth et al. | 369/14 |
| 5,541,888 | * 7/1996 | Russell | 365/234 |
| 5,661,608 | * 8/1997 | Barbier et al. | 359/800 |
| 5,719,620 | * 2/1998 | Allio | 348/49 |
| 5,854,780 | * 12/1998 | Opheij et al. | 369/112 |

FOREIGN PATENT DOCUMENTS

| | | |
|---|---|---|
| 0 474 473 A3 | 9/1991 | (EP) . |
| 0 569 718 A2 | 4/1993 | (EP) . |
| PCT/US92/ 11356 | 7/1993 | (WO) . |
| PCT/SE93/ 00126 | 8/1993 | (WO) . |

* cited by examiner

Primary Examiner—Ali Neyzari
Assistant Examiner—Kim-Kwok Chu
(74) Attorney, Agent, or Firm—Mathews, Collins, Shepherd & Gould, P.A.

(57) ABSTRACT

Method of storing and retrieving information by exposing cells of a storage medium to a first beam of light having a first set of properties affecting the optical properties of said storage medium, and by exposing a plurality of individual cells, forming a page of information, of said storage medium to a second beam of light having a second set of properties. A third light beam from said storage medium forms an image of said page on a detecting means. The detected light image is converted into electric data signals, each bit of said data signals corresponding to a cell of said storage medium. The first beam of light is generated by a first light source and there is provided an electrooptical means having an electric input for receiving data and being arranged for modulating said first light beam in dependance of said data. The storage medium comprises a plurality of pages, each page having a plurality of individual cells, and optical properties of said individual cells of said storage medium being changed by said first light beam to correspond to said data.

20 Claims, 11 Drawing Sheets

MEMORY CARD RECORDING/ REPRODUCING WITH TWO LIGHT SOURCES AND A LIGHT VALUE MATRIX

TECHNICAL FIELD

The invention relates to a method and a device for the storing of information. Preferably the device is formed as a memory card. Such a card can be used for public data storage and archiving of documents in libraries, health care, and also for replacing micro fiche systems. The invention relates also to a system for positioning such a card.

PRIOR ART

Prior art optical memory cards are commercially available from Dexter Inc., USA and from Canon, Japan. The storage capacity of prior art cards is 4,2 Mbyte, and the write and read speed is approximately 30KByte/s. The information in the card is stored when a high energy laser beam burns a hole in a thin metal layer of the card. Information stored in the card is read by detecting a difference in reflection from a memory point and from said metal layer.

SUMMARY OF THE INVENTION

According to the invention there is used a passive storage media having a layer of photoinduced light absorbing and transmitive properties. Preferably data is written or stored in the media by exposing an area in the layer having a plurality of elements to an image containing any desired information. When the layer is exposed to light different properties of the elements are changed. Data is read out by exposing said elements to light and analyzing the absorbing proporties in each of the elements. Light is directed and controlled by an optical system.

The optical system including a multiporpose objective is intended to perform the following tasks:
  writing data into the storage medium
  reading-out data from the storage medium
  error signal generation for holding in position the storage medium
  positioning the storage medium in Z-direction.

Writing can be defined as a local modification of the optical properties of the storage medium by a linearly polarised laser light, preferably a blue laser. To perform writing it is approriate to control the light wavelength, the light intensity (spatial distribution and magnitude), the intensity pattern, the light polarisation and the wavefront shape.

Reading-out can be defined as the retrieving of information encoded in the storage medium. To perform reading-out it is approriate to control the light wavelength, the light intensity (spatial distribution and magnitude), the the light polarisation and the wavefront shape. Preferably a red laser is used.

An error signal is used by means that moves the storage material to determine when the memory pixels are imaged precisely and sharply onto the CCD pixels. This requires control of:
  X-Y position of the storage medium (i.e. translation in its plane)
  orientation of the storage medium (i.e. rotation around the Z-axis which is perpendicular to its plane)
  position of storage medium along the Z-axis (i.e. perpendicularly to its plane).

The X-Y position of the storage medium will be identified by special "marker symbols" written into the storage medium during its fabrication. The error signal resulting from their misposition (translation as well as orientation) will be generated by photodetectors onto which they are imaged by an objective. This procedure is a kind of "tracking".

Positioning the storage material along the Z-axis is controlled by other means. There is a lens system which produces spots of focused light at a fixed distance from the objective in the storage material. These spots are reflected by the memory card and then are analyzed through a lens system by photodetectors. This and similar procedures are called "autofocusing".

The optical system has also to carry out the correction which was determined by the error-signal of autofocusing. This requires that parts of the objective be movable, separately from the other parts of the optical system.

The functions of illumination, directing light containing the information to be stored onto the storage medium, imaging the storage medium onto a detector and the error signal generation preferably will all be implemented by the same objective. However, the different functions require some additional elements.

Preferably a side-chain liquid crystalline (SCLC) polyester film is used as a storage medium. An image containing information to be stored is created in an electrooptical element and is imaged on the storage medium. In one embodiment the storage medium is formed as a "write once read multiplicate" (WORM) device. It is possible to erase stored information in any memory position and again write in an erased position. Data can be erased either by a erasure of the complete storage medium in one step or by a selective erasure of specific memory blocks. It is also possible to use a device according to the invention in a more conventional rotating medium.

DETAILED DESCRIPTION

Figure 1:
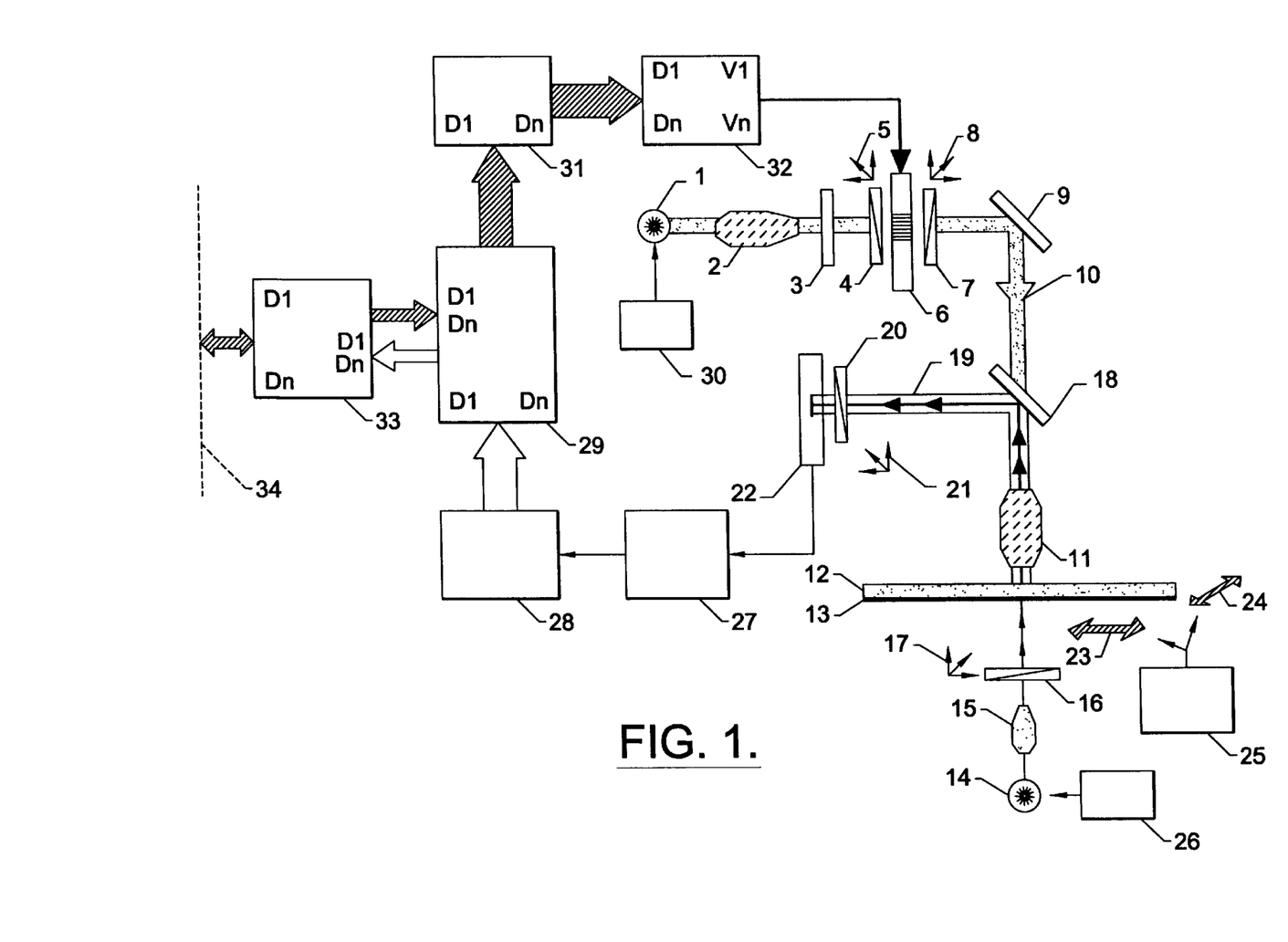
FIG. 1 is an optical and electrical block diagram showing writing and reading of information in one embodiment according to the invention.
Figure 2:
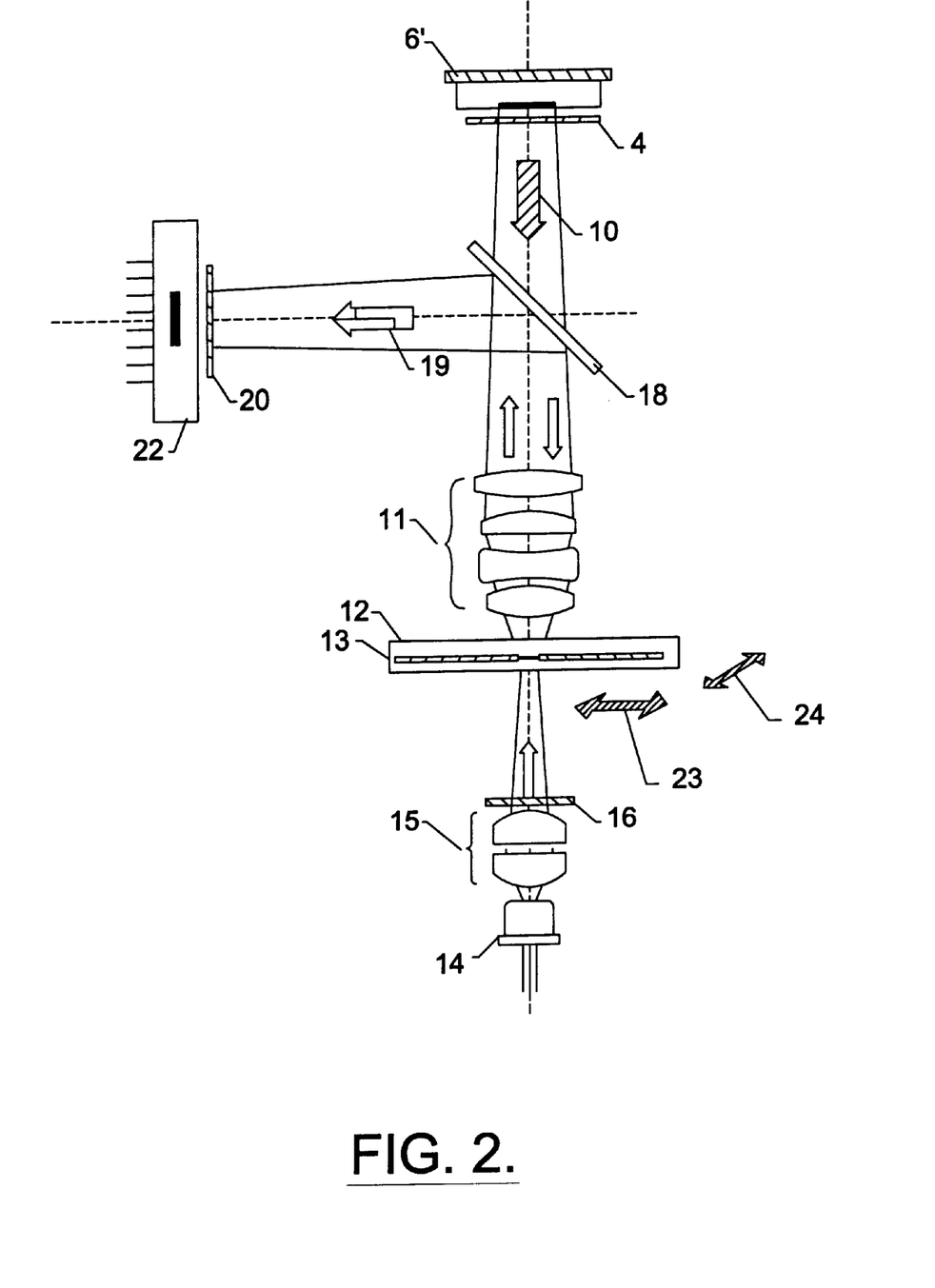
FIG. 2 is a side view showing the optical arrangement in an embodiment according to the invention in which a laser matrix is used as a light source.

In FIG. 1 a light source 1 generates a light beam which is either coherent or non-coherent. The light is passed through a condensor lens system 2 and further on to a first polarizer 4 through a filter 3. The polarized light beam passes through an electrooptical element 6 which in the embodiment according to FIG. 2 is a polarization rotator. The rotator 6 is a matrix organized active light rotating element which turns the polarization direction of the light. The polarization direction of the light emitted through said first polarizer 4 is shown at 5.

After passing through said electrooptical element 6 the polarization direction of the light has been changed in some pixels which is shown at 8. Only light pixels having the polarization direction 8 passes in this embodiment through a second polarizer 7. A beam path of the light beam emitted through said second polarizer 7 is deflected 90° by a totally reflecting mirror 9 and is passed through a dielectric or semi reflecting mirror 18. The beam is formed as a light matrix 10. The function of the mirror 18 is to separate the beams appearing during writing and reading to and from the storage medium. Instead of a mirror a prism can be used.

In a preferred embodiment said rotator is formed by liquid crystals, for instance of ferroelectric type, and comprises n×m individually addressable active pixels in a x-y matrix. In one embodiment the polarization rotator comprises 256× 256 pixels, each pixel being 15 $\mu$m×15 $\mu$m. The rotator can be described as an information mask, the rotation direction of the light for the pixel coinciding with the polarisation direction 5 representing a binary ONE, while pixels having a rotation direction perpendicular to said polarisation direction 5 represent a binary ZERO. For all pixels the light vector of the polarised light can be rotated by an electric field applied to each pixel individually.

An objective system 11 forms an image of the pixel matrix generated by the electrooptical element 6 and images it on a storage medium or storage means 13. When the information is stored in the storage medium absorbing or transmitive properties of the medium are changed in some pixels in dependance on the information content. The magnification of the objective system determines the size of the pixels in the storage medium 13. Normally the magnification will be −2 to −9, that is the pixel size on the medium 13 will be 1.7 $\mu$m to 7.5 $\mu$m.

A relative movement between the optical system and the storage medium in the X direction 23 and in the Y direction 24 will allow reading and writing from and to all sections of the storage medium. The movement is controlled by a positioning control unit 25.

The image as described above contains the information which is stored in an information block, or page, in the storage medium. The information stored in a side-chain liquid crystalline (SCLC) polyester film is stabilized by exposing for a short period of time the storage medium to light from a second light source 14. Normally, the light source 14 used to stabilize the information can be used also in the reading process described below. The storage medium will be described in more detail with reference to FIGS. 5–7. For some materials only one light source is required. Writing and reading is made by changing other properties of the light than the wavelength.

When reading the information stored in the storage medium said light source 14 emits a beam. In different applications the light source 14 can be a coherent source, such as a laser diode, or a non-coherent source such as a semi conductor diode. A second condensor 15 forms the beam to the same size as that of the information block, and a third polarizer 16 gives the beam the polarization direction shown at 17. The polarized light passes through the storage medium 13 and an image of the information block is magnified in the objective system 11. The light containing the stored information is deflected by the semi reflecting mirror 18 and then passed on in a beam 19 through a polarization analyzer 20 to a detecting means 22. In the embodiment shown said detecting means is a matrix having discrete detecting cells. Only light having the polarization direction shown at 21 will be received by the detecting matrix 22. The detecting matrix 22 comprises at least the number of pixels as the electrooptical element 6. An expected higher number of pixels in the detecting matrix 22 is required to detect the pattern in the image corresponding to the information. The image imaged on the detecting matrix 22 comprises an intensity modulated light matrix or pattern having alternating dark and light pixels (see also FIGS. 3 and 4) depending on the information stored in the storage medium.

The light sources 1 and 14 are operatively connected to light intensity control units 30 and 26, respectively. The detecting matrix 22 is operatively connected to an interface and detector control unit 27. Data detected by said detecting matrix 22 is transferred to a central unit 29 through a first buffer 28.

The central unit 29 is operatively connected to a driving unit 32 through a second data buffer 31. Said driving unit 32 is operatively connected to said electrooptical element 6 for controlling individual pixels in the light matrix.

The electrooptical element 6 can also be provided in the form of an electrically addressable spatial light modulator, EASLM. Such devices are commercially available, and do not as such form part of the invention. Reflective, as well as transmissive, EASLM:s are available and can be used.

In an alternative embodiment, not shown, the electrooptical element 6 comprises a plurality of micromirrors in a matrix. Each micromirror corresponds to one pixel and can be rotated 10 degrees in two directions. The mirror is connected to an underlying yoke which in turn is supended by two thin torsion hinges to support posts. The yoke is electrostatically attracted to underlying yoke address electrodes. The mirror is electrostatically attracted to mirror address electrodes. The mirror and yoke rotate until the yoke comes to rest against mechanical stops that are at the same potential as the yoke. The position of the mechanical stops limits the mirror rotation angle to +10 or −10 degrees in a practical embodiment. An underlying static random access memory (SRAM) cell is used to address each pixel. The state of the SRAM cell determines which mirror rotation angle is selected. The mirrors can be 16 $\mu$m square. A Digital Micromirror Device (DMD) as described above is available from Texas Instruments.

It is also possible to generate a matrix of pixels that are either light or dark in an integrated vertical cavity laser diode matrix 6' as shown in FIG. 2. The light emission from each laser diode in the matrix can be controlled individually by an applied electrical field. The light matrix 10 generated by said laser diode matrix 6' is polarized in a polarizer 4 as described above. Light and dark pixels in the laser diode matrix 6' correspond to light and dark pixels, respectively, generated by the electrooptical element 6 and the associated polarizer 7. An advantage of using a laser diode matrix 6' is more integrated optics and a lower number of components, but it is more difficult to provide a light matrix of a large size. Other elements and the structure of the embodiment according to FIG. 2 correspond to the embodiment shown in FIG. 1.

Figure 3A:
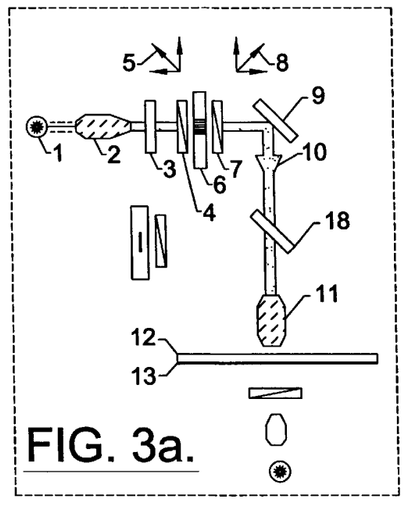
FIG. 3a–FIG. 3f illustrate writing and reading steps in a system using an electrically addressable electrooptical element for generating a light matrix.
Figure 3B:
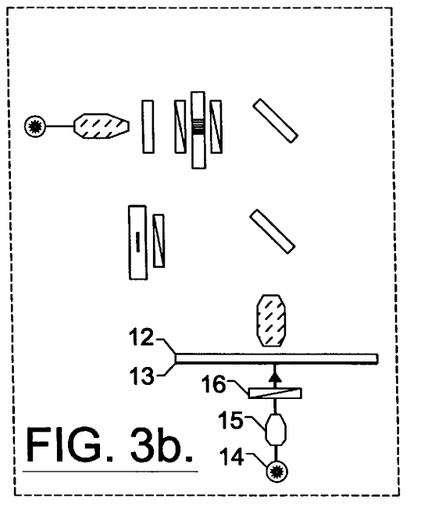
Figure 3C:
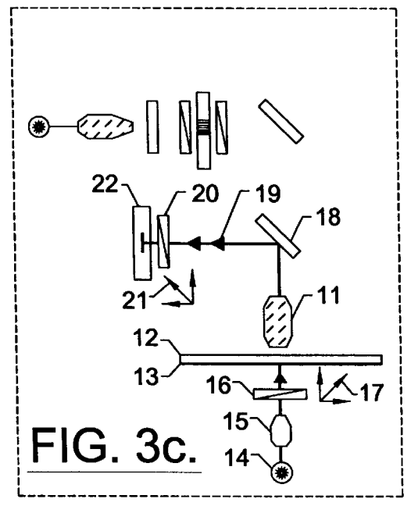
Figure 3D:
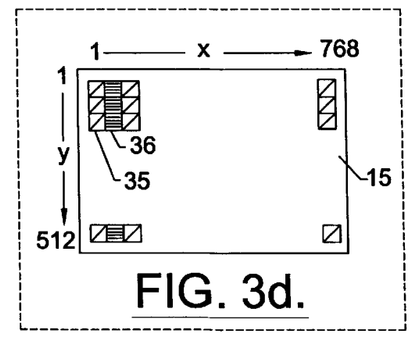

The writing process will now be described in more detail with reference to FIG. 3a and FIG. 3d. A beam generated in the light source 1 and condensed in the condensor 2 is filtered in a wave length selective filter 3 and then polarized in the first polarizer 4. The polarization direction 5 of the light received by the electrooptical element 6 is turned 90° in those pixels that are addressed by the electrooptical element 6. This 90° turned polarization direction coincides with the polarization direction 8 of the polarizer or analyzer 7. Thus, light of said pixels will be allowed to pass through said polarizer 7. The result is a light matrix of alternating light 35 and dark 36 pixels.

Figure 3E:
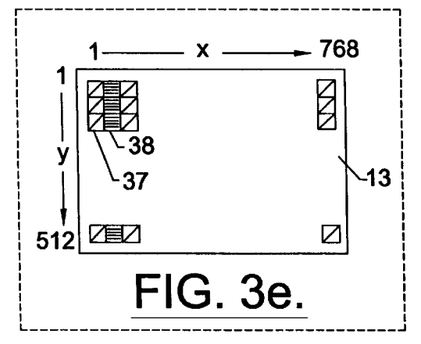
Figure 3F:
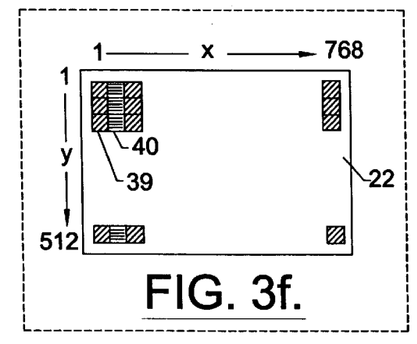

The foton energy in the dark pixels will not be sufficient to change the molecules, or the molecule structure, in the storage medium 13. In light pixels the polarization direction of Azo molecules will be turned 90° as shown in FIG. 3e. A pixel 37 showing a changed polarization direction may indicate a ONE and will allow light having a coiciding polarization direction to pass through the storage medium. Pixels in which the polarization direction has not been changed will effectively attenuate the polarized light which can be observed as dark pixels 38 or ZERO:s.

After stabilizing the storage medium 13 with light from the second light source 14 data can be retrieved from the storage medium 13 by directing a beam of light polarized in said third polarizer 16 towards a plurality of memory cells of the storage medium 13. The polarization direction of said third polarizer 16 corresponds to the direction of the Azo molecules in pixels having a changed orientation in the storage medium 13.

The polarized light passes through the storage medium 13 and an image of the stored information from all pixels is formed by the objective 11. The objective 11 will enlarge the image with a factor 2–9 corresponding to the reduction when writing). Then the enlarged image is reflected towards the fourth polarizer 20 allowing only light having a polarization direction 21 to pass through. The light passing through said fourth polarizer 20 will be detected by the detecting matrix 22 as an image having light pixels 39 and dark pixels 40 (see FIG. 3f).

Figure 4A:
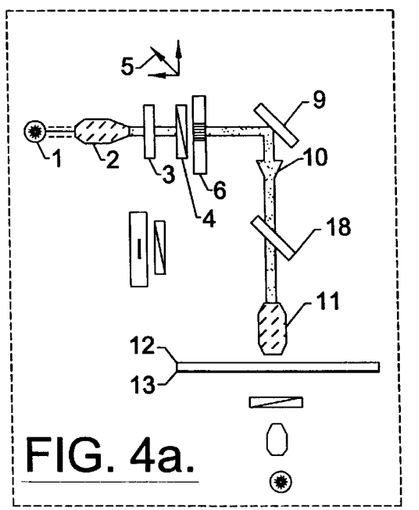
FIG. 4a–FIG. 4f illustrate writing and reading steps in an alternative system according to the invention.
Figure 4B:
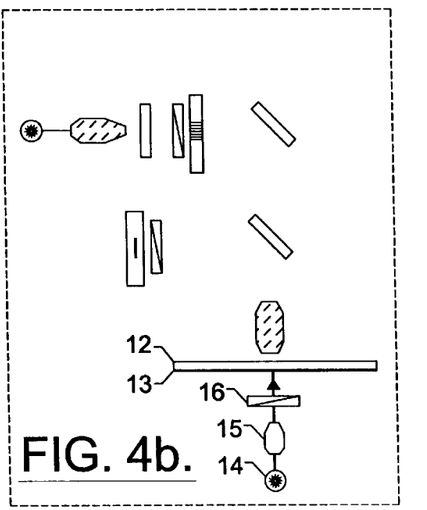
Figure 4C:
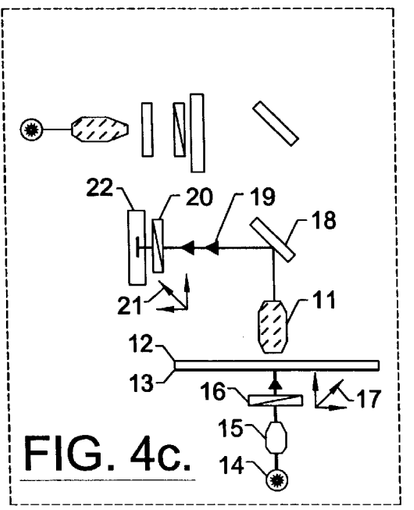
Figure 4D:
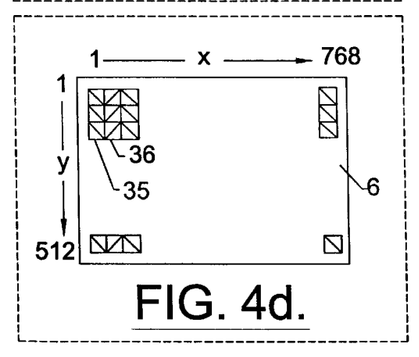
Figure 4E:
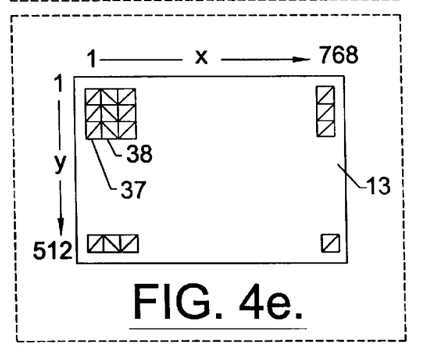

In an alternative embodiment according to FIGS. 4a–4f no second polarizer 7 is used. In this case the image formed by the objective 11 and projected on the storage medium 13 will comprise a matrix of pixels having alternating polarization directions. In a preferred embodiment the polarization direction is displaced 90° between logical ONE:s and ZERO:s. Thus, the structure of all storage positions in the storage medium 13 will changed by the light. FIG. 4e shows at 37 and 38 the polarization direction of different pixels of the storage medium 13.

Figure 4F:
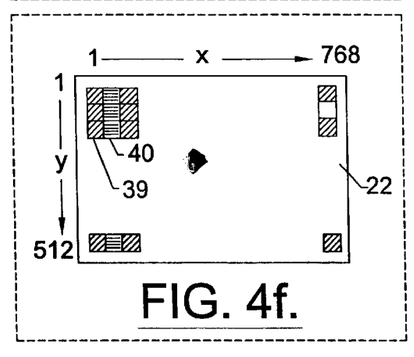

The reading process of the embodiment shown in FIG. 4c and FIG. 4f corresponds to the process described in connection with FIG. 3. Light generated in the second light source 14 is again polarized in a polarizer 16 and passed through the storage medium 13. Before reaching the detecting matrix 22 the light is also analyzed with regard to the polarizing direction in a fourth polarizer or polarization analyzer.

Figure 5:
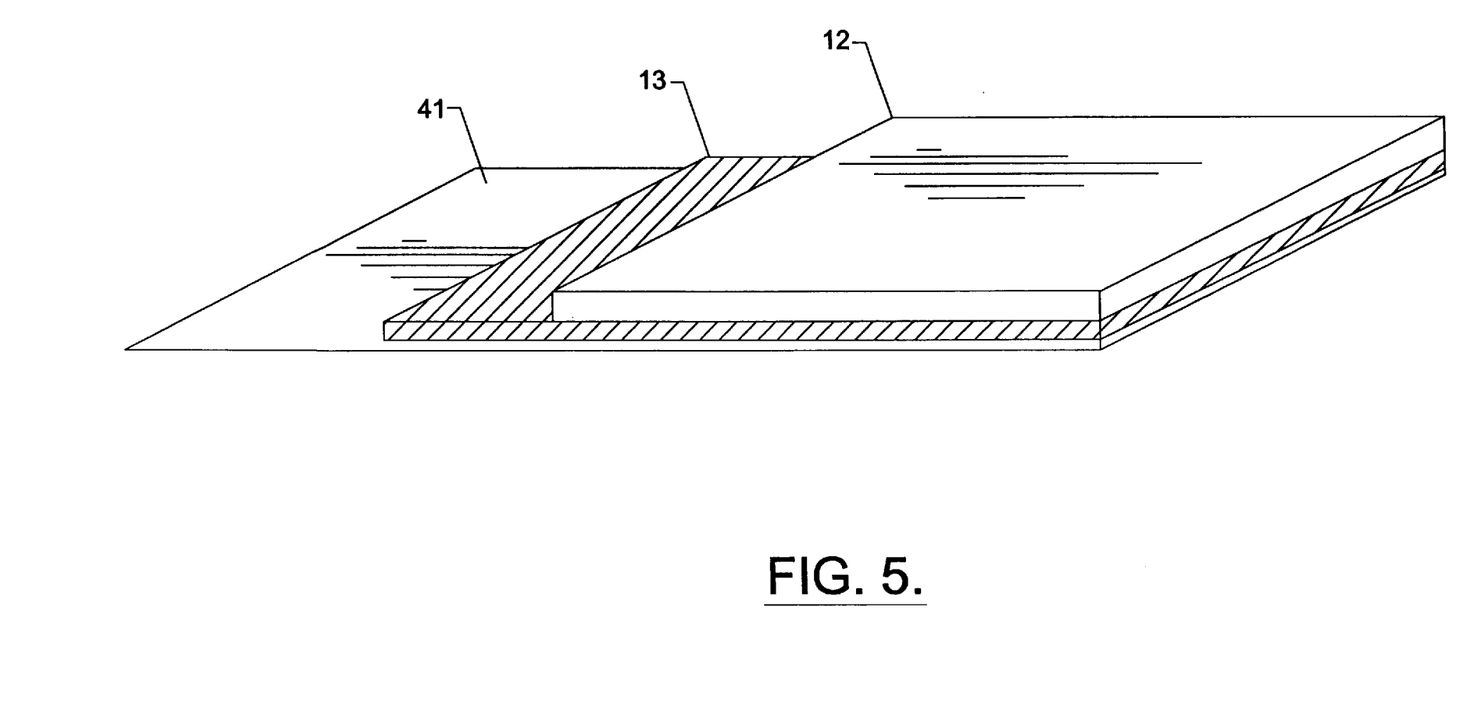
FIG. 5 is a perspective view showing the structure of an embodiment of a memory card according to the invention.

The structure of a memory card including an embodiment of the invention is shown in FIG. 5. The memory card comprises an optically transparent substrate 12 approximately 1 mm thick. An organic polymeric thin film composition 13 is applied on the substrate. The thickness of said polymeric film is approximately 5 $\mu$m. The material is protected by a protective layer 41. In a preferred embodiment the composition 13 is an organic side-chain liquid crystalline polyester film (SCLCP), made for instance of Azobense. SCLCP materials have a good storage capacity and an excellent spatial resolution. The photoinduced orientation and reorientation of dye-containing SCLC polymers cause a modulation in the complex refractive index of the film. There is an optically induced anisotrophy and dichroism which is stable and the resolution is at least 5000 lines/mm. Different short wave laser light sources having a wavelength within an interval of 400–530 nm can also be used. The required exposition time is 20 s to 180 s at an intensity of 50 or 5 mW/cm$^2$, respectfully. The wavelength and the exposition time are dependant on the material. As an alternative a reflective layer can be added to said transparent substrate 12 to provide a reflective function instead of a transmissive function as disclosed above. Such an embodiment is further disclosed below with reference to FIGS. 11a and 11b.

When storing data in a SCLCP material a two foton process is used. The writing of information into the material is made at another wavelength than when the information is read. Data is stored in the material by exposing the material to a polarized light source of approximatiely 400–530 nm wave length. In each illuminated memory position the polarized light will turn the polarization direction of the Azomolecules to a direction perpendicular to the light vector of the polarized light. Normally, the stored information is stabilized by exposing the material to light having an approximate wavelength of 680 nm. When reading the information light of 500–680 nm wavelength is used. This means that the same light source that stabilizes the material can be used to read the information. The light used for stabilizing and reading should not affect the storage medium in the same way as the writing light.

Figure 6:
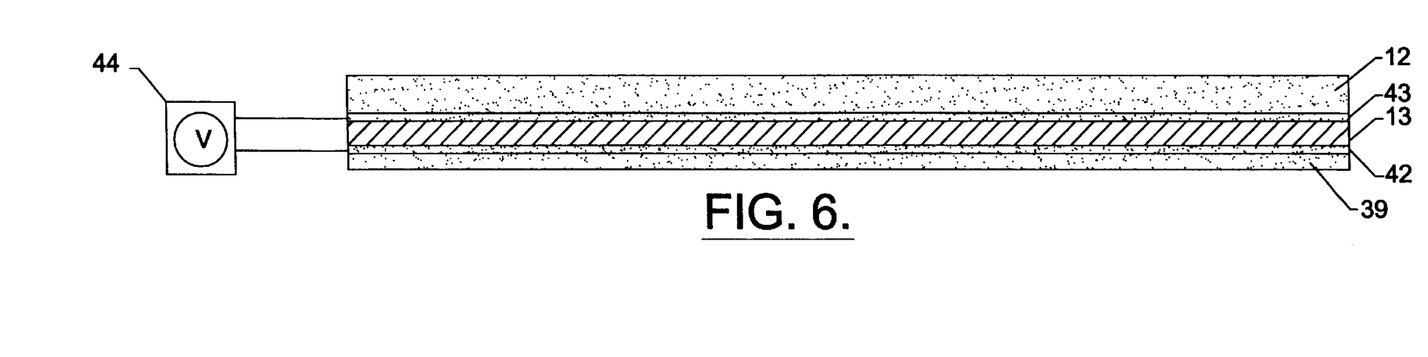
FIG. 6 is a perspective view of an alternative embodiment according to the invention.

Information stored in the storage medium can be erased by heating the material. The heating can be general to the complete card or selective at each block of memory. A complete erasure is shown in FIG. 6 according to which a first transparent electrode 42 is provided on a first side of the storage medium 13 and a second transparent electrode 43 is provided on an opposite side of the storage medium 13. A voltage source 44 is connected to said electrodes and can be controlled to generate an electric field between the electrodes. The electric field will heat the storage medium to a temperature required to obtain a complete erasure.

Figure 7:
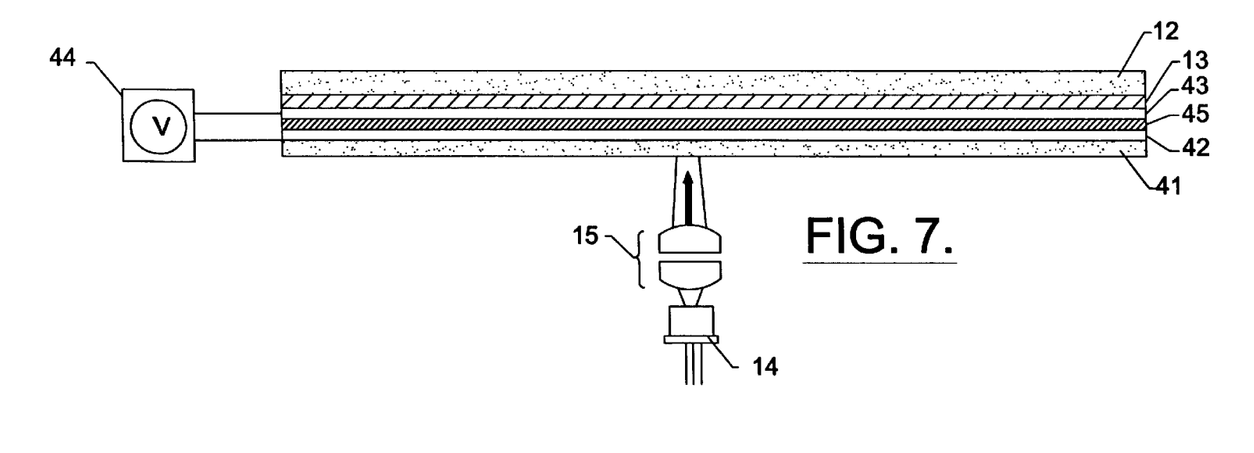
FIG. 7 is a view showing an alternative embodiment according to the invention in which memory blocks can be selectively erased.

In FIG. 7 a selective erasure is shown. A layer comprising a photoconductive semiconductor 45 is provided between said first and second electrodes 42 and 43. The photoconductive layer forms a high resistive electric insulation when an electric field is generated between said electrodes 42 and 43 and there is no light exposure on the photoconductive layer 45. However, when a selected section, or page, of the photoconductive layer 45 (and the corresponding storage medium 13) is exposed to light from a light source such as the second light source 14 the resistance in that section falls and the storage medium 13 will be heated correspondingly in the selected section to erase said section.

Figure 8:
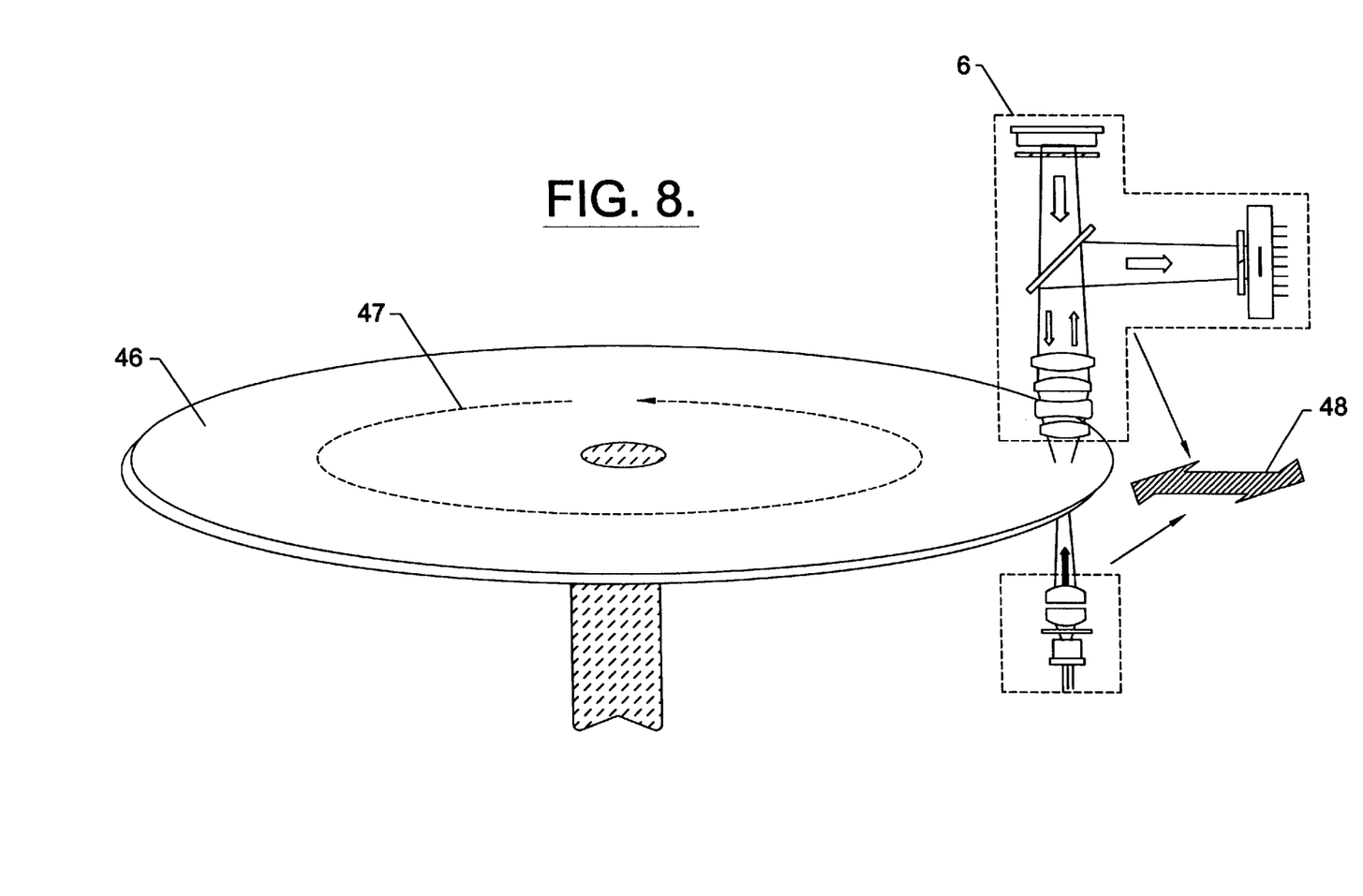
FIG. 8 illustrates an embodiment of the invention used in a rotating memory system.

The invention can be used also in an embodiment in which the storage medium is formed as a rotating disc 46 as shown in FIG. 8. The structure of the disc and the storage medium corresponds to the structure shown in FIG. 5. Writing and reading of information can be performed as disclosed above. Electric and optical means, such as lenses, polarizers and detectors are mounted axially displaced on either side of the disc 46 and can be moved in a radial direction 47 towards the center of the disc by means of a positioning device that is not further described.

Information can be written onto the disc in a concentric arrangement 48. The disc rotates at a controlled speed, which in such an embodiment can be set comparatively low. In relation to presently available systems the access time still is very high. It is also possible to store and read large amounts of information simultanously.

Figure 9A:
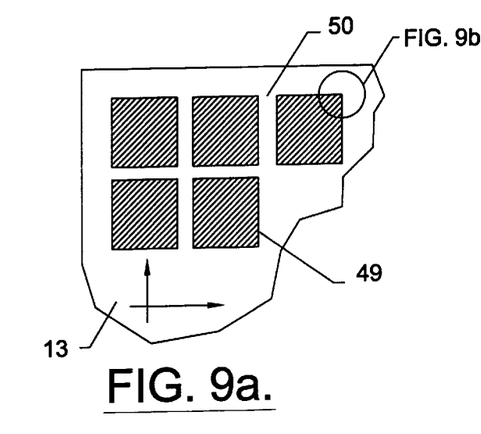
FIG. 9a is a schematic view showing definitions of basic elements of a storage medium according to the invention.
Figure 9B:
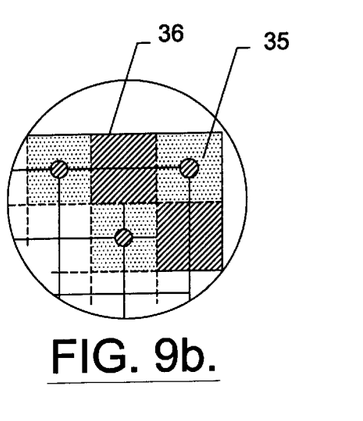
FIG. 9b is an exploded view of a portion of FIG. 9a, FIG. 10 is a side view showing an embodiment of an objective used in an embodiment of the invention.

FIGS. 9a and 9b show on the left side a segment of the substrate of the storage medium 13. On the substrate there is arranged a plurality of pages 49 separated by page separators 50. Each page 49 is a data segment comprising n×n bits or pixels. A broken out part on the right of FIG. 9 shows a part of a page 49 containing light pixels 35 and dark pixels 36. All pixels 35 and 36 of a page 49 can be accessed simultanously.

In a preferred embodiment the number of pixels of the electrooptical element 6, referred to as a SLM (Spatial Light Modulator) below, is 256×256 and the corresponding SLM pixel size 15×15 $\mu$m. The pixel size of the storage medium, or the Optical Memor Card, OMC, would be 2×2 $\mu$m.

The SLM pixel size and the required OMC pixel size determine the magnification of the objective. These pixel sizes suggest that the imaging must be diffraction limited. The field height of the objective is determined by the prescribed pixel number and pixel size (autofocusing and tracking also require some extra space around the OMC data page).

The main concept of the objective design is that the same objective should be used for write-in and read-out. Thus, theoretically, the imaging from the SLM to the detecting matrix, a CCD in a preferred embodiment, will be realized without distortion. However, since a different wavelength is used for write-in and read-out this won't be perfectly true, i.e. the objective must have been corrected for distortion as well. The distortion of the objective was prescribed so that it be smaller than one OMC pixel at the corner of the OMC data page.

The read-out algorithm will restore the information written into the OMC from the intensity pattern measured by the CCD. This implies that the illumination of write-in and read-out must be homogeneous. Assuming homogeneously emitting light sources, it means the elimination of vignetting. Appropriate placement of the aperture stop solves this problem, but object points of different height will see the entrance pupil at different angles even in this case. This can be avoided with a pupil that is much farther from the optical system than the object size. These systems are known as telecentric objectives. Since the objective must work similarly from each direction, this means that it should also be inverse telecentric.

Figure 10:
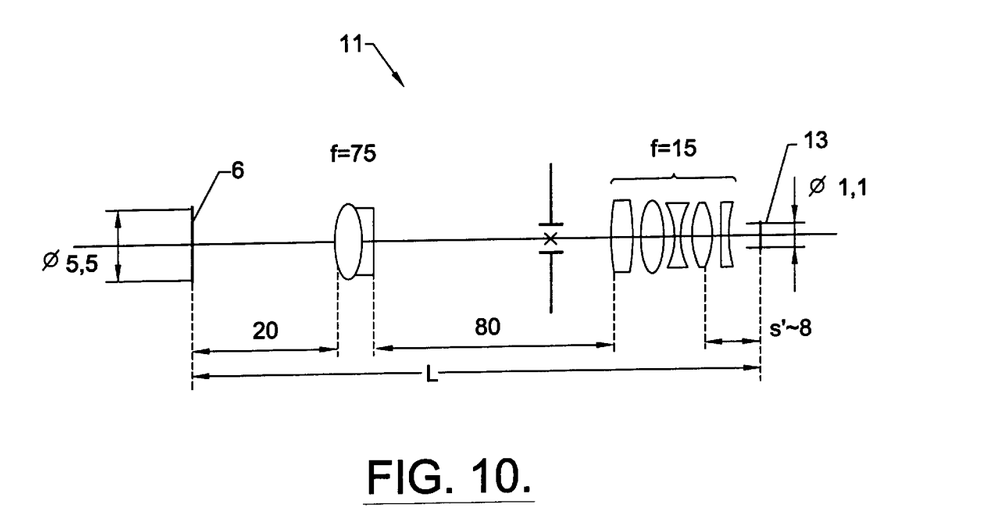

FIG. 10 shows one embodiment of the objective system 11. In this embodiment a telecentrical and an inverse telecentrical objective is used. The image formation is made by those rays which arise from the object within an angle equal to the spreading angle of the condenser 15.

Figures 11A, 11B:
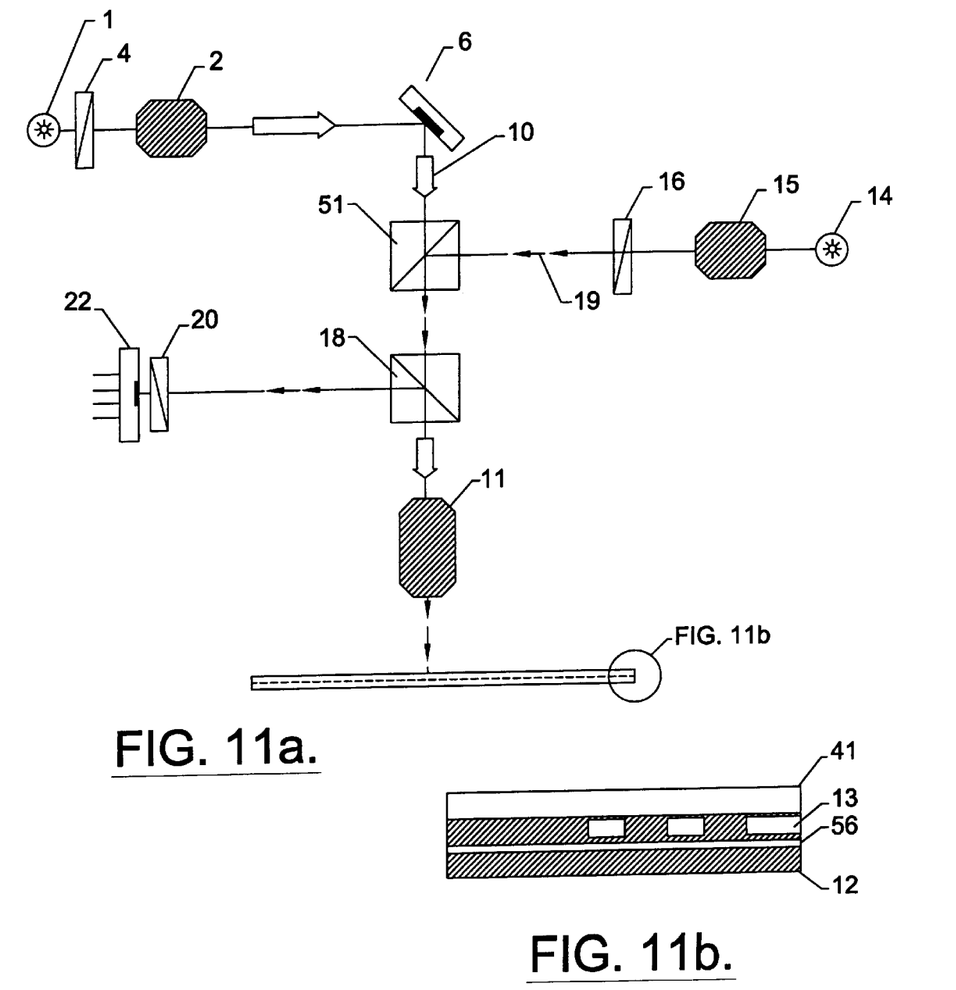
FIG. 11a and FIG. 11b show an alternative embodiment in which reflected light is used for read-out of information.

FIG. 11a and FIG. 11b show an alternative embodiment comprising basically the same elements and means as the embodiment shown in FIG. 1. The main difference is that said second light source 14 directs light towards the storage medium during reading in the same direction as said first light source 1 during writing. To accomplish this a prism 51 or a second semi reflecting mirror is arranged in the beam path of the light beam leaving the electrooptical element 6 in the direction of the storage medium 13. This also means that a reflective layer 52 is applied on one side of the storage medium 13, so as to reflect incident light through the storage medium layer 13.

A protective layer 41 is applied on the other side of the storage medium 13. In embodiments using a reflective function of the memory card it is possible to provide one side of the card with any printed data, such as information about the data stored in the card or pictures. As an alternative the card can be double sided to contain twice the amount of information.

There is a need for autofocusing, since the depth of focus of the objective is in the order of a few microns, which cannot be held at inserting the OMC into the read/write equipment. If the OMC is not in focus, the objective must be adapted to the changed object/image distances. This can be accomplished by a slight mispositioning of part of the objective. Thickness tolerance of the OMC cover can also be compensated this way. The operating conditions of autofocusing can be:

OMC cover thickness tolerance: ±10 $\mu$m.

OMC position tolerance: ±0.1 mm

The operation of automatic focusing at ±0.1 mm OMC displacement has been examined. The result of calculations made show that the moving part of the objective follows the OMC movements, i.e. the distance between the card surface and a 16th surface of the objective is almost permanent, 1.099 mm. The difference from this distance is less than 0.7 $\mu$m at the edge of the examined ±0.1 mm range. The Strehl-intensity doesn't drop under 0.95 in the adjusted system, neither in red nor in blue.

The ±10 $\mu$m thickness change of the protective layer in the card can be compensated with ±4 $\mu$m displacement of the moving part of the objective. This means that if the cover thickness decreases with 10 $\mu$m, the distance between the 16th surface of the objective and the reflective layer (i.e. the object plane) must be reduced by 4 $\mu$m. The compensation is efficient enough to retain the Strehl-intensity above 0.95 in red as well as in blue.

An error signal generated is used to identify the current position of the OMC with respect to the ideal object plane. The system described below assumes the OMC card to be near focus, which means a distance from the ideal plane in the order of the focus depth, i.e. a few microns. This range is the maximal distance of the OMC from object plane, at which the error signal still varies linearly with the OMC displacement. The precision of the autofocusing system is determined by the focal depth of the objective.

Figure 12:
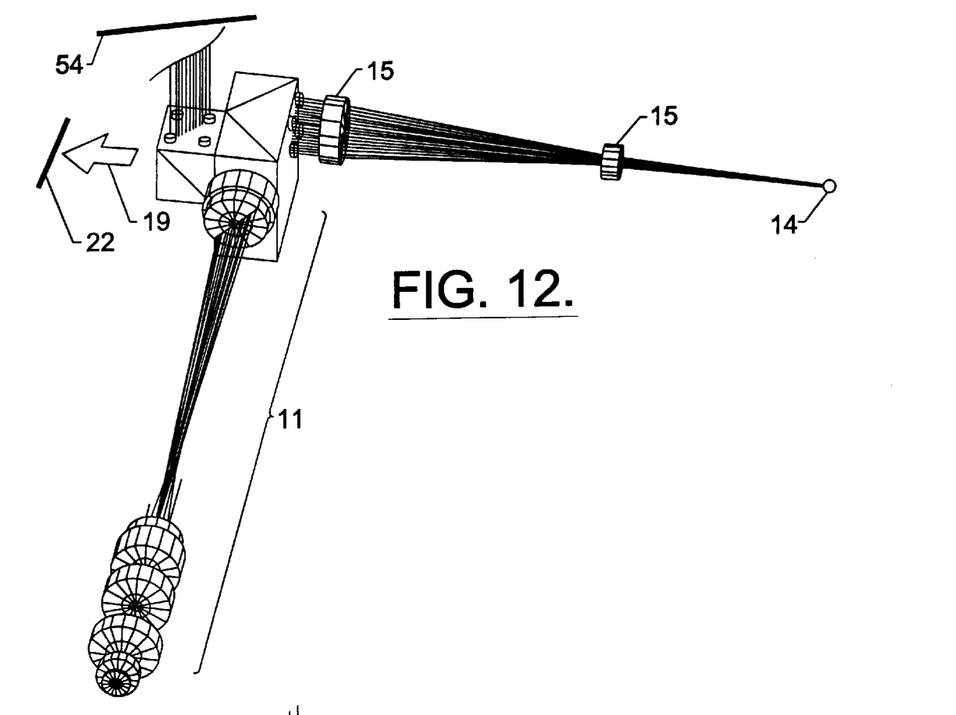
FIG. 12 is a perspective view of optical and electric elements included in an embodiment of the invention.
Figure 13:
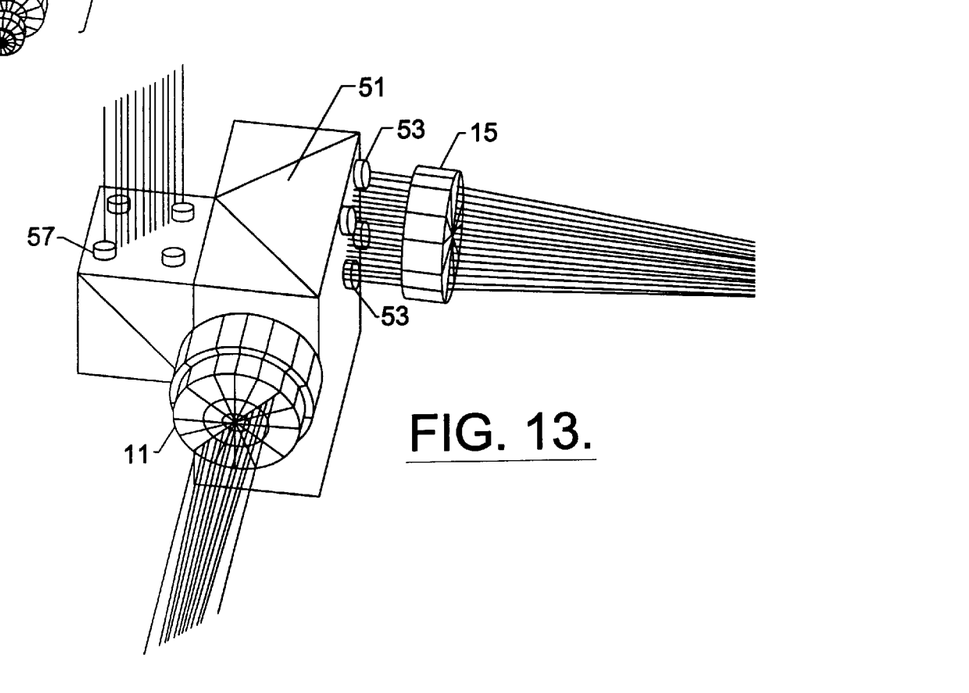
FIG. 13 is an enlarged view of the embodiment shown in FIG. 12.

For the purpose of position determination there is used spots of light focused onto the card by the objective; referred to as "calibration spots" as shown in FIG. 12 and FIG. 13. The creation of these spots requires "virtual object points" that can be imaged onto the reflective layer embedded in the OMC by the objective. Virtual object points are made by a first set of small negative lenses 53 placed into the collimated beam of the illumination system, and then imaged into the storage medium by the objective. The mirror layer of the card (the position of which represents the ideal object plane) reflects this spot, which is imaged by the objective onto a photodetector 54 through a second set of lenses 57. The prism 51 shown in FIGS. 13 and 12 also has the function of the mirror 18 as shown in FIG. 11a and will direct read-out light 19 towards the detector matrix 22.

These imaged spots will change their position as the card moves, i.e. will be defocused from the detector. Placing a cylindrical lens into the ray path between the objective and the photodetector we gain an astigmatic beam with two focus lines. If the OMC moves in the vicinity of the focus depth, only the position of the astigmatic spot will change, not its shape. Hence, using a four-segment photodetector 54 for the analysation of the spot, the position of the circle cross section of the beam between the two focal lines can be precisely detected. The detector is placed so that this circle cross section be imaged onto it when the OMC is in best focus.

Since the OMC can also be slightly tilted there is needed a couple of calibration spots to find its optimal position; this is why not only one spot is used.

It must also be noted here, that the distance of the circle cross section of the astigmatic beam measured from the last prism surface is not the same as the image distance of the objective. This must be taken into account at the selection (or design) of the photodetectors. To make these distances equal, the calibration spots should be positioned before or after the ideal place of the OMC (i.e. the object plane).

Another important aspect of the system design is that a phase-to-intensity converter filter used mustn't be placed in the light path of the autofocusing system, for the varying intensity would cause serious problems in the operation of the autofocusing system.

It is also preferred that the autofocusing system should work independently of an OMC card positioning system and of the reading-out algorithm. This will result in an autofocusing system of continuous operation, which hence can be very fast.

Tracking is used to identify which OMC data page is currently imaged onto the CCD array, and to control the imaged OMC page position on the CCD surface. This latter means translation as well as rotation, which movements are fine corrections of the card position, hence are in the order of a few OMC pixels. (The movements themselves will be carried out by the card moving mechanism and not by the objective!)

Figure 14:
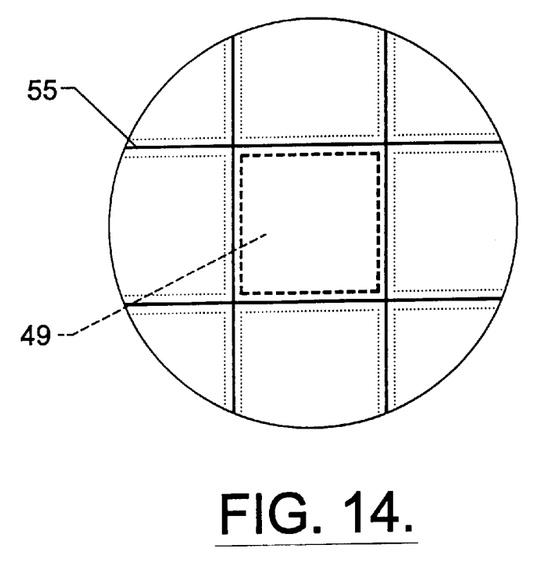
FIG. 14 is a schematic view of a cut out section of a storage medium used in one embodiment of the invention.
Figure 15:
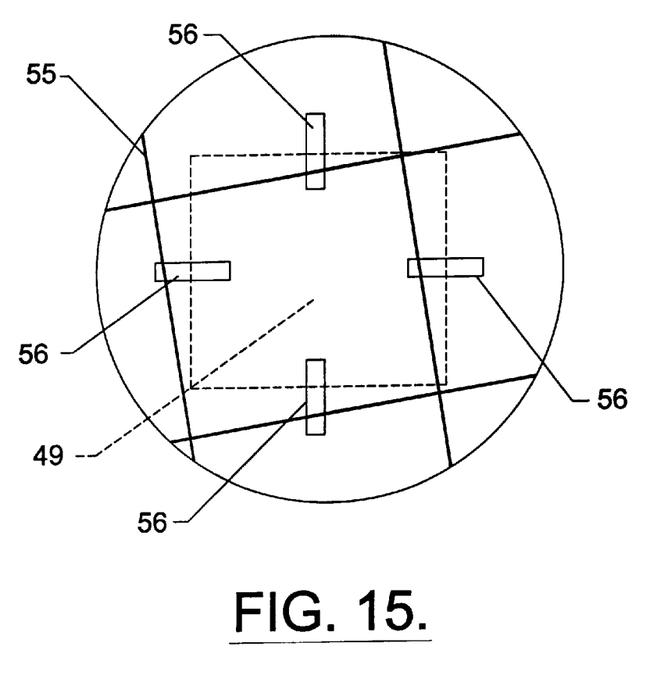
FIG. 15 shows the section of FIG. 14 in a misposition.

A system for tracking is shown in FIG. 14 and in FIG. 15. The position determination requires signs written onto the card. In a preferred embodiment said signs are in the form of square grid pattern 55 of the reflecting layer embedded in the card. Using the red light of the read-out illumination source the objective images the square grid onto four line detectors 56. Since the stripes of the square grid doesn't reflect light, the detectors 56 will see them black. The line detectors 56 are perpendicular to the stripes and there is one detector on each side of the square that represents one data page 49. In FIG. 15 the square grid of the reflective layers mispositioned with respect to the detector matrix 22.

The position of the stripes, and hence of the card, is determined from the position of the black spots measured by the detectors. In case the card is slightly rotated, the distance of spots measured by the two detector lines on the opposite side of the square, will increase. Thus the rotation angle can be determined independently of the card position.

The length of the detector lines will be determined from the accuracy of the card moving mechanism (since the stripe must always fall onto it), while the size of one detector segment can be determined from the required precision of fine positioning.

What is claimed is:

1. A device for storing and retrieving information comprising:
   a first light source for generating a first light beam;
   an electrooptical means having an electric input for receiving data and being arranged in a matrix having individually addressable matrix elements for modulating said first light beam in dependence of said data;
   a storage medium provided in the beam path of said first light beam after said electrooptical means, said storage medium comprising a plurality of pages, each page having a plurality of individual cells, and optical properties of said individual cells of said storage medium being changed by said first light beam to correspond to said data, said storage medium is a side-chain liquid crystalline polyester film;
   a second light source for exposing at least one page of said storage medium to a second light beam without changing the optical properties thereof; and
   at least one optical means positioned on an optical axis between said storage medium and said electrooptical means and having a telecentric objective, said optical means forming a first image of said matrix emitted from said electrooptical means on said storage medium or magnifying said page of said storage medium to form a second image on a detecting matrix, said first image having pixels corresponding to said matrix elements and said second image having pixels corresponding to said cells, and said detecting matrix being operatively connected to a central unit for transferring said second image detected by said detecting matrix.

2. The device according to claim 1, wherein said telecentric objective images said light emitted from matrix elements of the electrooptical element on the storage medium and images the cells of the storage medium on the detecting matrix.

3. The device according to claim 1, wherein the telecentric objective is a combined telecentric and inverse objective.

4. The device according to claim 1, wherein the telecentric objective comprises a moving part following the movement of the storage medium.

5. The device according to claim 1, further comprising:
   means for providing movement between said optical means and said second light source in relation to said storage medium so as to access all pages of the storage medium.

6. The device according to claim 1, wherein the individual cells of said storage medium change the polarization direction of incident light depending on the information stored in the cell.

7. The device according to claim 6, wherein a polarizer is provided in the beam path between the second light source and the storage medium.

8. The device according to claim 1, wherein said first light source has a wavelength in an interval of 400–500 nm.

9. The device according to claim 8, wherein said first laser source is a laser.

10. The device according to claim 1, wherein said second light source has a wavelength in an interval of 600–750 nm.

11. The device according to claim 10, wherein said second laser source is a laser.

12. The device according to claim 1, wherein said storage medium is a polymer material.

13. The device according to claim 1, wherein said electrooptical element comprises an electrically addressable spatial light modulator that is arranged to generate an image including said data.

14. The device according to claim 13, wherein said electrically addressable spatial light modulator is arranged to reflect incident light.

15. The device according to claim 1, further comprising:
   a first set of objective means to direct spots of light onto said storage medium; and a second set of objective means to direct spots of light onto a position detecting means.

16. The device according to claim 1, further comprising:

a prism to direct light from said second light source towards said storage medium, and to direct light from said storage medium towards said detector.

17. An optical memory card including a device according to claim 1, wherein a layer of said storage medium is applied to a supporting support substrate; and a reflecting layer is applied to said layer of the storage medium to reflect incident light from said second light source through said storage medium.

18. A device for storing and retrieving information comprising:

a first light source for generating a first light beam;

an electrooptical means having an electric input for receiving data and being arranged in a matrix having individually addressable matrix elements for modulating said first light beam in dependence of said data;

a storage medium provided in the beam path of said first light beam after said electrooptical means, said storage medium comprising a plurality of pages, each page having a plurality of individual cells, and optical properties of said individual cells of said storage medium being changed by said first light beam to correspond to said data, said storage medium is a side-chain liquid crystalline polyester film;

a second light source for exposing at least one page of said storage medium to a second light beam without changing the optical properties thereof; and at least one optical means positioned on an optical axis between said storage medium and said electrooptical means and having a telecentric objective, said optical means forming a first image of said matrix emitted from said electrooptical means on said storage medium or magnifying said page of said storage medium to form a second image on a detecting matrix, said first image having pixels corresponding to said matrix elements said second image having pixels corresponding to said cells, and said detecting matrix being operatively connected to a central unit for transferring said second image detected by said detecting matrix, wherein, the electrooptical means comprises a plurality of individually addressable micromirrors.

19. A device for storing and retrieving information comprising:

a first light source for generating a first light beam;

an electrooptical means having an electric input for receiving data and being arranged in a matrix having individually addressable matrix elements for modulating said first light beam in dependence of said data;

a storage medium provided in the beam path of said first light beam after said electrooptical means, said storage medium comprising a plurality of pages, each page having a plurality of individual cells, and optical properties of said individual cells of said storage medium being changed by said first light beam to correspond to said data, said storage medium is a side-chain liquid crystalline polyester film;

a second light source for exposing at least one page of said storage medium to a second light beam without changing the optical properties thereof; and at least one optical means positioned on an optical axis between said storage medium and said electrooptical means and having a telecentric objective, said optical means forming a first image of said matrix emitted from said electrooptical means on said storage medium or magnifying said page of said storage medium to form a second image on a detecting matrix, said first image having pixels corresponding to said matrix elements and said second image having pixels corresponding to said cells, and said detecting matrix being operatively connected to a central unit for transferring said second image detected by said detecting matrix, wherein, said storage medium is provided with signs for recording position determination and said signs for recording position determination are provided as a square grid pattern in a reflecting layer adjacent to said storage medium.

20. The device according to claim 19, further comprising:

four line detectors to detect stripes of said grid pattern, and wherein said line detectors are perpendicular to said stripes.

* * * * *